United States Patent
Li

(10) Patent No.: US 7,809,052 B2
(45) Date of Patent: Oct. 5, 2010

(54) TEST CIRCUIT, SYSTEM, AND METHOD FOR TESTING ONE OR MORE CIRCUIT COMPONENTS ARRANGED UPON A COMMON PRINTED CIRCUIT BOARD

(75) Inventor: Gabriel Li, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 911 days.

(21) Appl. No.: 11/460,444

(22) Filed: Jul. 27, 2006

(65) Prior Publication Data

US 2008/0025383 A1   Jan. 31, 2008

(51) Int. Cl.
*H04B 3/46* (2006.01)

(52) U.S. Cl. ........................................ 375/226

(58) Field of Classification Search ............... 375/226, 375/371, 373; 714/738, 742
See application file for complete search history.

(56) References Cited

U.S. PATENT DOCUMENTS

| | | | |
|---|---|---|---|
| 4,845,255 | A | 7/1989 | Iwahara et al. |
| 4,890,065 | A | 12/1989 | Latetin |
| 5,124,597 | A | 6/1992 | Stuebing et al. |
| 5,315,164 | A | 5/1994 | Broughton |
| 5,410,191 | A | 4/1995 | Miura |
| 5,563,605 | A | 10/1996 | McEwan |
| 5,682,114 | A | 10/1997 | Ohta |
| 5,835,501 | A | 11/1998 | Dalmia et al. |
| 5,933,039 | A | 8/1999 | Hui et al. |
| 5,959,479 | A | 9/1999 | Woodward |
| 6,055,287 | A | 4/2000 | McEwan |
| 6,060,922 | A | 5/2000 | Chow et al. |
| 6,762,634 | B1 | 7/2004 | Hattori |
| 6,853,227 | B2 | 2/2005 | Latetin |
| 7,093,177 | B2 * | 8/2006 | West et al. .................. 714/738 |
| 7,138,841 | B1 | 11/2006 | Li et al. |
| 7,388,937 | B1 * | 6/2008 | Rodger et al. ............... 375/348 |
| 2001/0011893 | A1 | 8/2001 | Walker |
| 2003/0076181 | A1 * | 4/2003 | Tabatabaei et al. ........... 331/57 |
| 2004/0205431 | A1 | 10/2004 | Moore et al. |
| 2004/0223559 | A1 | 11/2004 | Hill |

(Continued)

OTHER PUBLICATIONS

Veillett et al., "Stimulus Generation for Built-In Self-Test of Charge-Pump Phase-Locked Loops," Proceedings of the International Test Conference, Oct. 1998, pp. 698-707.

(Continued)

*Primary Examiner*—Khanh C Tran

(57) ABSTRACT

A test circuit, system, and method are provided herein for testing one or more circuit components arranged upon a monolithic substrate. According to one embodiment, the system may include a test circuit and one or more circuit components, all of which are arranged upon the same monolithic substrate. In general, the test circuit may be configured for: (i) receiving an input signal at an input frequency, (ii) generating a test signal by modulating a phase of the input signal in accordance with a periodic signal, and (iii) supplying either the input signal or the test signal to the one or more integrated circuits, based on a control signal supplied to the test circuit. More specifically, the test circuit may be used to determine the jitter and/or duty cycle distortion (DCD) tolerance of any system component without changing the frequency of the clock signal supplied to the component or injecting noise into the clock recovery system.

19 Claims, 11 Drawing Sheets

U.S. PATENT DOCUMENTS

| | | | |
|---|---|---|---|
| 2004/0243899 | A1 | 12/2004 | Bonneau et al. |
| 2004/0252802 | A1 | 12/2004 | Yamaguchi |
| 2005/0044463 | A1 | 2/2005 | Frisch |
| 2005/0097420 | A1* | 5/2005 | Frisch et al. ............. 714/742 |
| 2005/0116759 | A1 | 6/2005 | Jenkins et al. |
| 2005/0149784 | A1 | 7/2005 | Ishida et al. |
| 2005/0271131 | A1 | 12/2005 | Hafed et al. |

OTHER PUBLICATIONS

Cheng et al., "High Accuracy Jitter Measurement Using Cyclic Pulse Width Modulation Structure," International Symposium on VSLI Design, Automation & Test, Apr. 2005, pp. 24-27.

International Search Report, PCT/US2007/073435, mailed Mar. 13, 2008.

The Written Opinion of the International Searching Authority for International Application No. PCT/US071073435 dated Mar. 13, 2008; 6 pages.

USPTO Notice of Allowance for U.S. Appl. No. 11/014,578 dated Jul. 20, 2006; 6 pages.

USPTO Non-Final Rejection for U.S. Appl. No. 11/014,578 dated Apr. 4, 2006; 6 pages.

Efendovich et al., "Multifrequency Zero-Jitter Delay-Locked Loop," IEEE Journal of Solid-State Circuits, vol. 29, No. 1, Jan. 1994, pp. 67-70; 4 pages.

* cited by examiner

TEST CIRCUIT, SYSTEM, AND METHOD FOR TESTING ONE OR MORE CIRCUIT COMPONENTS ARRANGED UPON A COMMON PRINTED CIRCUIT BOARD

BACKGROUND OF THE INVENTION

1. Field of the Invention

This invention relates to integrated circuits (ICs) and, more particularly, to an internal test circuit that may be used for supplying a highly controlled amount of jitter and/or duty cycle distortion to one or more circuit components arranged upon a common printed circuit board.

2. Description of the Related Art

The following descriptions and examples are given as background only.

Many electronic systems (such as communication systems, computer systems, etc.) communicate by transmitting digital data signals between transmitting and receiving portions of the system. To avoid errors, the system receiver must sample the received data signal at the same frequency and phase with which the signal was initially digitized by the system transmitter.

In some cases, the transmitter may send a clock signal along with the digital data signal for controlling the timing with which the receiver samples the digital data signal. In other cases, the receiver may include a clock recovery system for generating the sample clock locally. For example, the receiver may use a feedback control system to adjust the frequency and phase of the sample clock signal based on data analysis the receiver acquires by observing the data signal.

Although the transmitter may synchronize the edges (or "signal transitions") of a digital data signal to the edges of a sample clock signal, variations in signal edge timing (i.e., "jitter") may cause the receiver to incorrectly sample the received data signal. For example, noise introduced into the transmitter (or within the clock or data signal paths) may cause the received data signal to appear "jittery" relative to the clock signal edges. The received data signal may also appear "jittery" to a receiver employing a clock recovery system when feedback errors or noise are introduced therein.

In general, "jitter" may be defined as the cycle-to-cycle variation in the threshold crossings of a signal. In other words, jitter may occur when the edges or transitions of a signal are shifted in time by different amounts over consecutive clock cycles. The signal transitions may be shifted either forward or backward. In some cases, jitter may cause the data signal to be shifted sufficiently in time to produce a "bit error" at the receiver when the data signal is incorrectly sampled by the clock signal. The bit error rate (BER) (i.e., the percentage of bit errors relative to the total number of bits received in a transmission) may be used to indicate how often a data signal must be retransmitted due to an error. High performance systems are typically characterized by low bit error rates.

The ability of a receiver to correctly sample a data signal in the presence of jitter is known as "jitter tolerance." In some cases, jitter tolerance may be defined as the amount of peak-to-peak jitter that can be present within a received signal without causing an unacceptable bit error rate. The measurement of jitter tolerance has become an important step in the manufacture of high-speed integrated circuits and receivers. In other words, the need to measure jitter tolerance has become increasingly more critical as timing budgets become tighter, due to increased clock speeds in computer systems and higher data rates in communications systems.

A number of conventional techniques have been used to measure jitter tolerance. In computer systems (and other systems employing digital ICs), off-chip IC testers have been used to introduce jitter into a test signal supplied to a device under test (DUT). In some cases, an IC tester (100) may include a jitter signal generator (110) for applying a known amount of jitter to a signal (e.g., $CLK_{IN}$) supplied to a DUT (120), as shown in FIG. 1. The DUT may be a monolithic integrated circuit (IC) chip, for example. The output of the DUT (e.g., $CLK_{OUT}$)—or, the response of the DUT to the jittered input signal (e.g., $CLK_{JITTER}$)—may then be passed to a response analyzer block (130) of the IC tester for determining the jitter tolerance associated with the DUT. In some cases, the response analyzer block may determine jitter tolerance by detecting the bit error rate associated with the output signal.

The type of jitter generator used to conduct the jitter tolerance test often impacts the validity of the test results. For example, some jitter generators may apply jitter by injecting noise into the input signal supplied to the DUT. The noise may be generated by a sinusoidal, deterministic or random jitter source. Unfortunately, the amplitude of the jitter added to the input signal cannot be controlled in this approach. Such jitter generators, therefore, cannot be used to measure jitter tolerance. For example, if a data bit is considered one Unit Interval (UI), the jitter amplitude may be represented as percentage of the UI. The jitter tolerance is a measure of the jitter amplitude in UI. For example, if the jitter amplitude is 0.75 UI, the jitter tolerance is also 0.75 UI. Thus, one can't measure jitter tolerance without controlling the amplitude of the jitter.

Other jitter generators may apply jitter to a control voltage supplied to a clock recovery system included within the DUT. For example, a receiver may include a phase-locked loop (PLL) or delay locked loop (DLL) device for recovering the sample clock signal. In general, PLLs are closed-loop devices that utilize voltage-controlled oscillators (VCOs) for obtaining accurate phase and frequency alignment between two signals, typically referred to as feedback and reference signals. Though similar, a DLL device differs from a PLL device in that it uses a delay line, instead of a VCO, for obtaining accurate phase and frequency alignment between the feedback and reference signals.

FIG. 2 illustrates one embodiment of a conventional PLL device 200. As shown in FIG. 2, PLL 200 may include a phase frequency detector (PFD) 210, a charge pump (CP) 220, a loop filter 230 and a voltage controlled oscillator (VCO) 240. During operational modes, PFD 210 compares the feedback signal ($F_{VCO}$) to the reference signal ($F_{REF}$) and generate corrective "up" and "down" pulses in response thereto. Next, charge pump 220 compares the durations of the corrective "up" and "down" pulses and generates a control current ($I_{CTRL}$), representing an error signal or phase correction signal. Loop filter 230 filters the error signal and adjusts the operating frequency of VCO 240 by supplying a control voltage ($V_{CTRL}$) thereto. In some cases, one or more frequency dividers (250, 260) may be included within the reference and/or feedback paths of the PLL to modulate the frequency of the reference and feedback signals.

As noted above, a jitter generator (e.g., 110, FIG. 1) may apply jitter to a DUT by modulating the VCO control voltage ($V_{CTRL}$) with noise. However, in addition to producing uncontrollable jitter amplitude, modulating the VCO control voltage in such a manner may cause the output frequency of the PLL (i.e., the sample clock frequency supplied to the DUT) to shift away from a desired operating frequency. This may invalidate jitter tolerance tests performed in systems or circuits specifically designed for operating at the desired frequency. In some cases, adding noise to the VCO control voltage may cause the PLL to lock onto the noise frequency, if the noise frequency is lower than that of the loop. This, too, would impede jitter tolerance tests by not allowing a jittered test signal to be supplied to circuit components within the DUT.

Using an off-chip IC tester to perform a jitter tolerance test provides its own set of disadvantages. For example, one may wish to perform a jitter tolerance test on one or more components of a monolithic integrated circuit (IC), or one or more IC chips arranged upon a system board (such as a printed circuit board). However, it is often difficult (if not impossible) to supply a jittered test signal to only a select number of the IC chips with an off-chip IC tester. For example, although a test multiplexer may be inserted in front of each DUT (e.g., each IC chip to be jitter tested), the additional multiplexers will consume valuable space (which may or may not be available) and introduce undesirable amounts of delay and jitter to the system during normal operation. Furthermore, use of an off-chip IC tester requires external pins or connectors to be added to the IC chip for injecting the noise into the test signal. Additional logic and routing components may also be needed to supply the jittered test signal to the internal circuitry of the IC. These additional components consume additional space and increase the amount of noise added to the clock distribution path.

Therefore, a need remains for an internal test circuit capable of providing a highly controlled amount of jitter to one or more components on a monolithic integrated circuit (IC), or one or more IC chips arranged on a printed circuit board. The internal test circuit would improve upon conventional jitter generators by providing a means for determining the jitter tolerance of any chip/system component without changing the frequency of the clock signal supplied to the component or injecting noise into the clock recovery system. The internal test circuit would also provide a dynamic injection of jitter pulses and controlled duty cycle distortions into the device under test, thereby, enabling the performance of the system to be fully characterized.

SUMMARY OF THE INVENTION

The following description of various embodiments of test circuits, systems and methods is not to be construed in any way as limiting the subject matter of the appended claims.

According to one embodiment, a test circuit is provided herein for testing one or more circuit components arranged upon a monolithic substrate. As used herein, the term "monolithic substrate" may refer to an integrated circuit (IC), a system board or any other circuit configuration formed within or upon a single wafer or chip of silicon. Unlike many prior art systems, the test circuit described herein may be arranged within or upon the monolithic substrate, along with the circuit components formed therein.

In some cases, the test circuit may include a jitter generator and output multiplexer. The jitter generator may be coupled for receiving an input signal and configured for generating a jittered test signal in response thereto. The multiplexer may be coupled for supplying either the input signal or the jittered test signal to one or more of the components arranged within or upon the monolithic substrate, depending on a control signal supplied thereto.

In some cases, the jittered test signal may be generated by modulating a phase of the input signal in accordance with a periodic signal. For example, the jitter generator may include a digital-to-analog converter (DAC), a programmable device and a comparator. In most cases, the DAC may be configured for generating an adjustable reference voltage that changes in accordance with the periodic signal. The programmable device, which is coupled to the DAC, may be configured for storing the periodic signal and controlling the changes made to the adjustable reference voltage. The comparator is coupled to the DAC and a charge storage device (e.g., a capacitor) for receiving the adjustable reference voltage and a linearly increasing voltage signal generated in response to the input signal. The comparator is, therefore, configured to generate the jittered test signal by shifting the phase of the input signal each time the linearly increasing voltage signal exceeds the adjustable reference voltage.

In some cases, the programmable device may include a first register for storing the periodic signal and a second register for controlling the manner in which the periodic signal is supplied to the DAC. For example, the periodic signal may include a set of precomputed data points, which control the changes made to the adjustable reference voltage when supplied to the DAC in succession. In one embodiment, the set of precomputed data points may represent a trigonometric waveform, a triangular waveform, a saw tooth waveform or a rectangular waveform, although other waveforms may be used. To control the adjustable voltage generated by the DAC, the second register may supply the precomputed data points to the DAC in succession and at a test frequency supplied to the second register.

In some cases, the programmable device may also include a third register for storing a "clean" or "non-jittered" signal. For example, the third register may be configured for storing another set of precomputed data points, which function to maintain a constant reference voltage when supplied to the DAC in succession. In such cases, the programmable device may include another multiplexer for supplying either the periodic signal (from the first register) or the clean signal (from the third register) to the DAC, based on a control signal supplied thereto.

According to another embodiment, a system is provided herein. For example, the system may include a test circuit and one or more integrated circuits, all of which are arranged upon the same monolithic substrate. As noted above, the test circuit may be configured for: (i) receiving an input signal at an input frequency, (ii) generating a test signal by modulating a phase of the input signal in accordance with a periodic signal, and (iii) supplying either the input signal or the test signal to the one or more integrated circuits, based on a control signal supplied to the test circuit.

In some cases, the system may include a clock recovery device, which is coupled to the test circuit and configured for generating a plurality of input signals based on a clock signal supplied thereto from an external source. For example, the clock recovery device may include a phase locked loop (PLL) or a delay locked loop (DLL) device, although other clock recovery devices may be used.

In some cases, the test circuit may receive and use only one of the plurality of input signals (or one complementary pair of input signals) for generating the test signal. For example, in addition to the jitter generator and output multiplexer, the test circuit may include an input multiplexer, in some embodiments, and one or more additional jitter generators, in other embodiments. In the first embodiment, the input multiplexer may be configured for receiving the plurality of input signals from the clock recovery device and for selecting the one input signal to be supplied to the jitter generator. In the second embodiment, the additional jitter generators may each be configured for receiving a different one of the input signals from the clock recovery device and for generating a different test signal in response thereto. One or more additional output multiplexers may also be coupled to the clock recovery device and the additional jitter generators for supplying a respective input signal or a respective test signal to one of the integrated circuits.

According to another embodiment, a method is provided herein for testing one or more circuit components arranged upon a monolithic substrate. For example, the method may include: (i) supplying an input signal to a test circuit arranged upon the monolithic substrate, (ii) using the test circuit to generate a test signal by modulating a phase of the input signal in a periodic manner, and (iii) testing at least one of the circuit components by supplying the test signal to the circuit component and observing its response.

In most cases, the phase of the input signal can be modulated by adjusting a first reference voltage in accordance with a first periodic signal and a second reference voltage in accordance with a second periodic signal. In some cases, the method may be used to determine the tolerance of the circuit component to jitter by using substantially identical first and second periodic signals. In other cases, the method may be used to determine the tolerance of the circuit component to duty cycle distortion by adjusting only one of the first and second reference voltages, or by using substantially different first and second periodic signals. In either case, the test signal is usually generated at the same frequency as the input signal is supplied to the test circuit.

BRIEF DESCRIPTION OF THE DRAWINGS

Other objects and advantages of the invention will become apparent upon reading the following detailed description and upon reference to the accompanying drawings in which.

Figure 1:
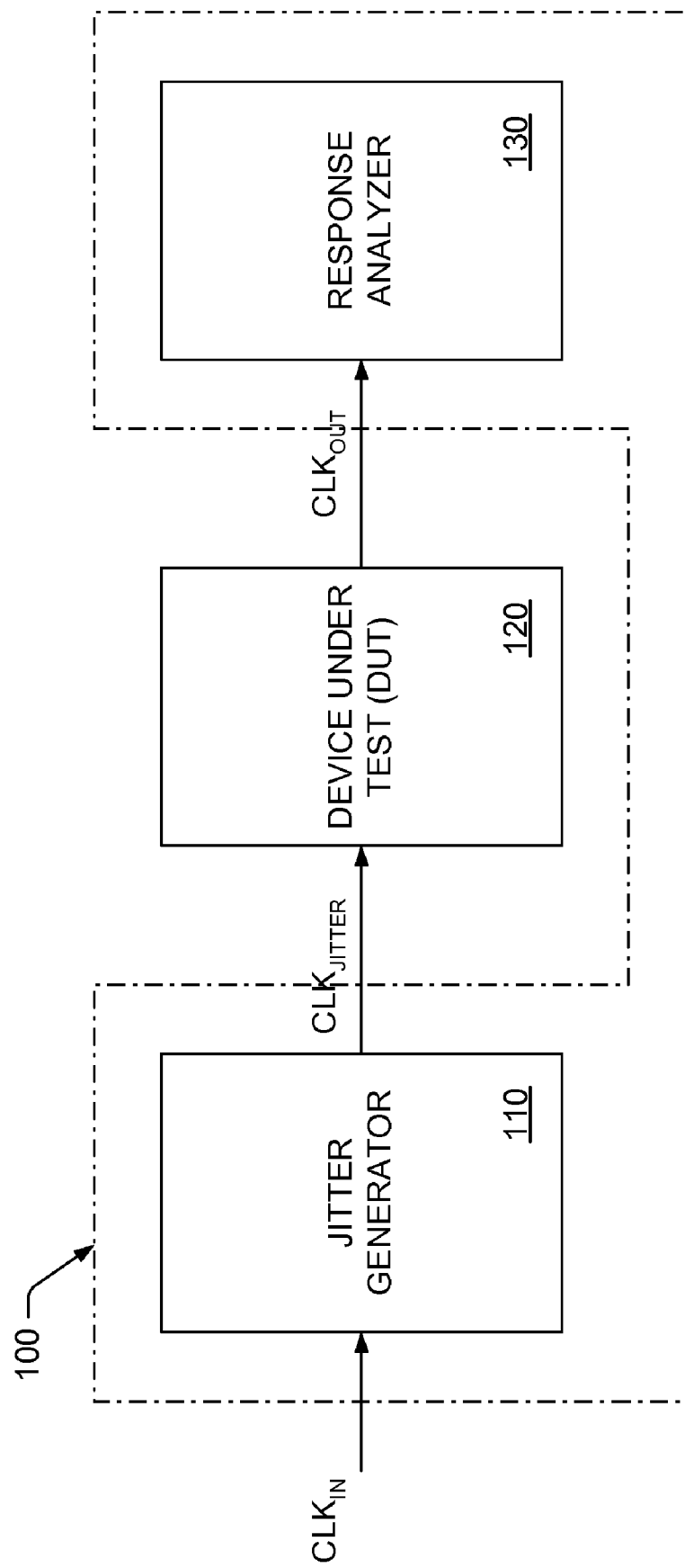
FIG. 1 is a block diagram illustrating a conventional off-chip IC tester used for determining the jitter tolerance of a device under test (DUT) by applying jitter to an input signal supplied to the DUT and observing its response.
Figure 2:
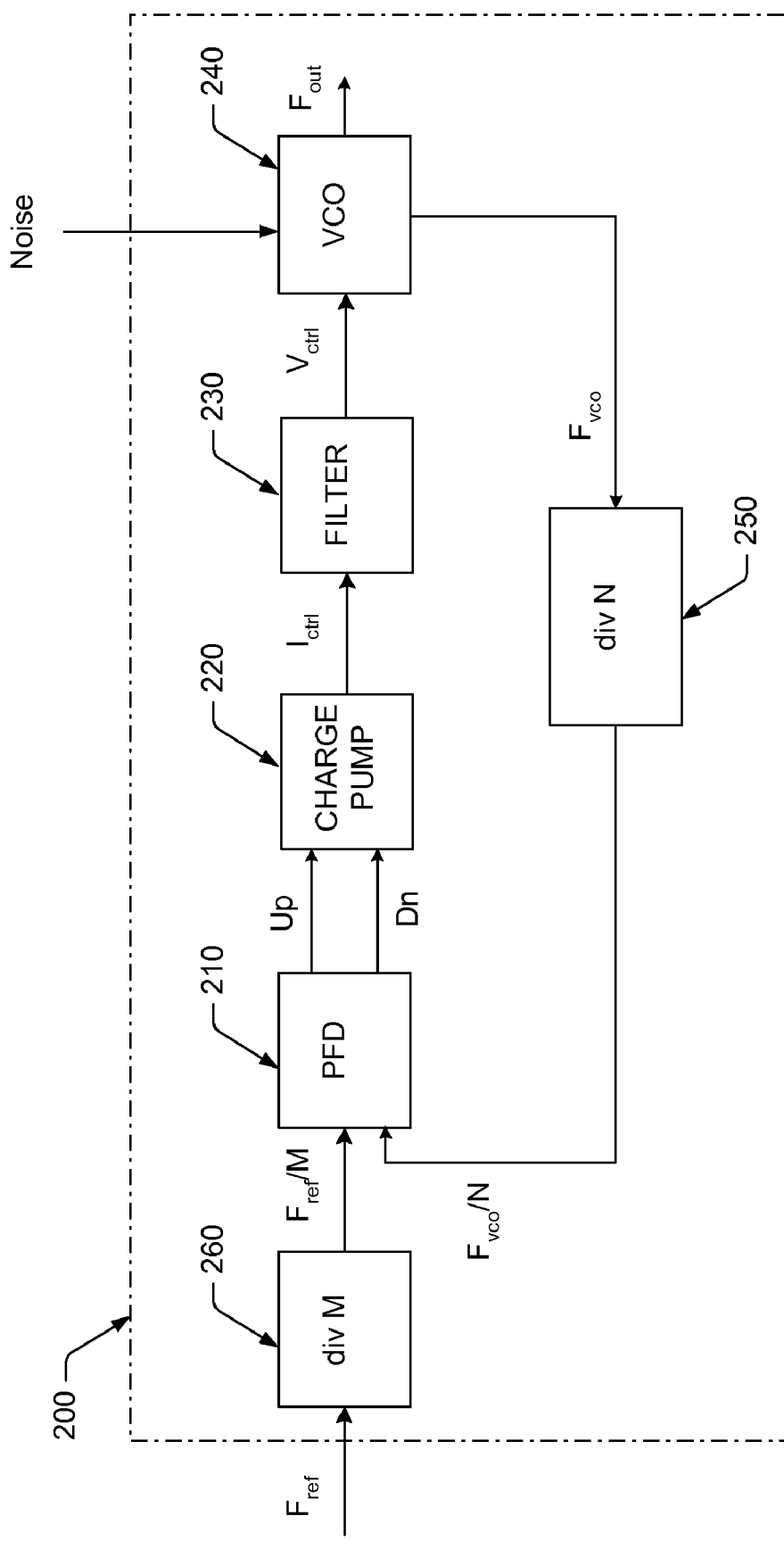
FIG. 2 is a block diagram illustrating a conventional method for supplying a jittered test signal to a DUT by modulating the control voltage of a clock recovery device (e.g., a PLL) with noise.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
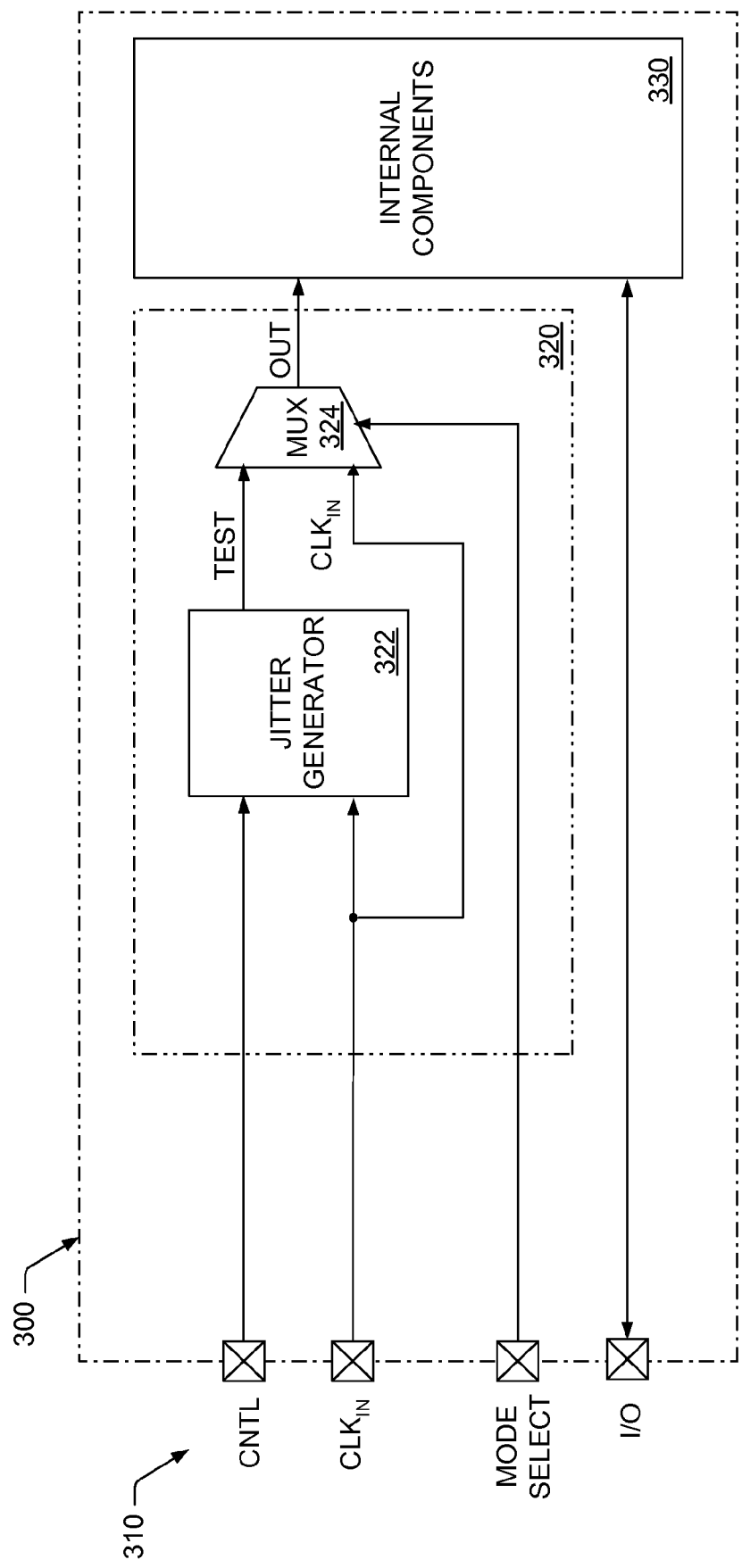
FIG. 3 is a block diagram illustrating one embodiment of an internal test circuit that may be used for determining the jitter and duty cycle distortion tolerance of one or more integrated circuits arranged on a monolithic IC chip or system board.
Figure 4:
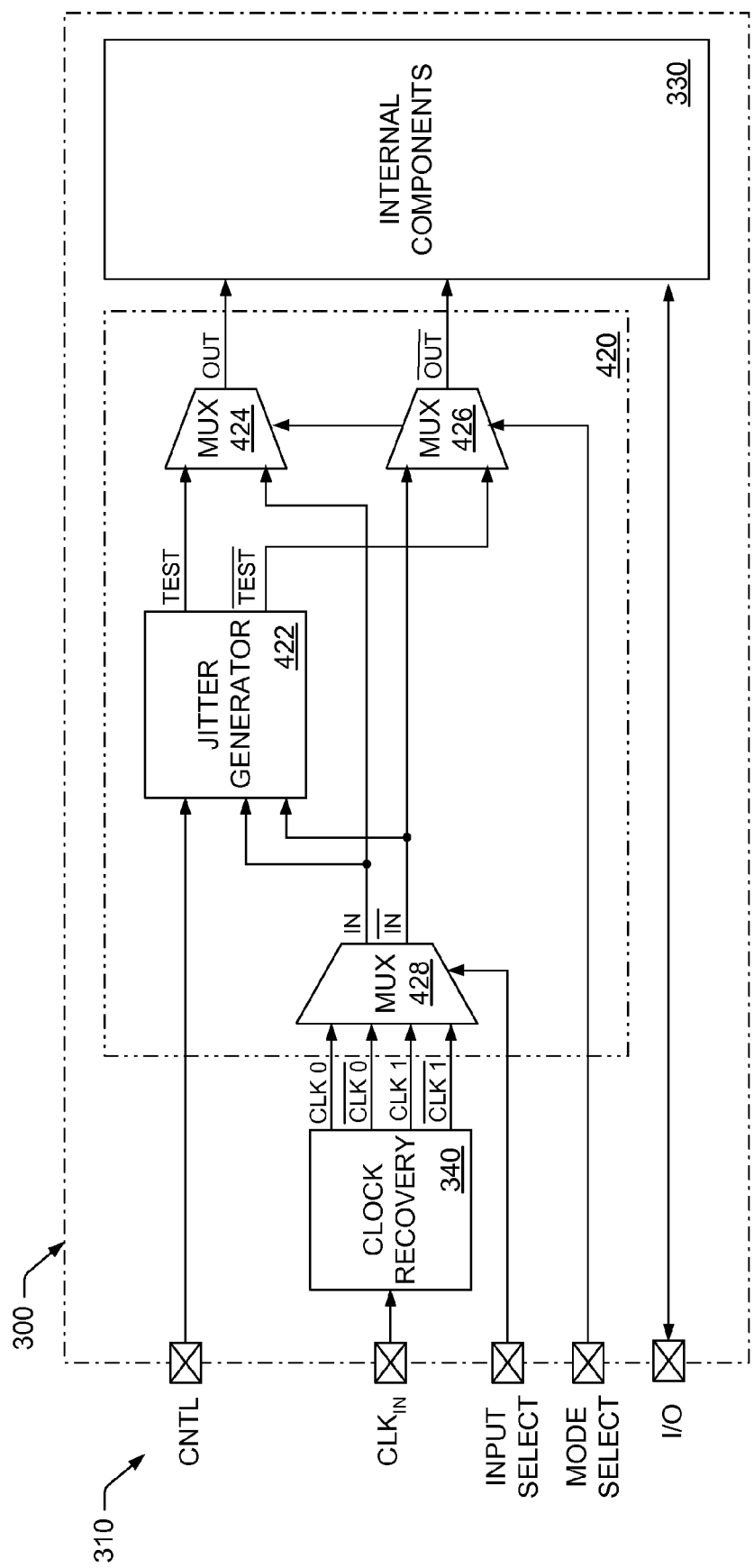
FIG. 4 is a block diagram illustrating another embodiment of an internal test circuit that may be used for determining the jitter and duty cycle distortion tolerance of one or more integrated circuits arranged on a monolithic IC chip or system board.
Figure 5:
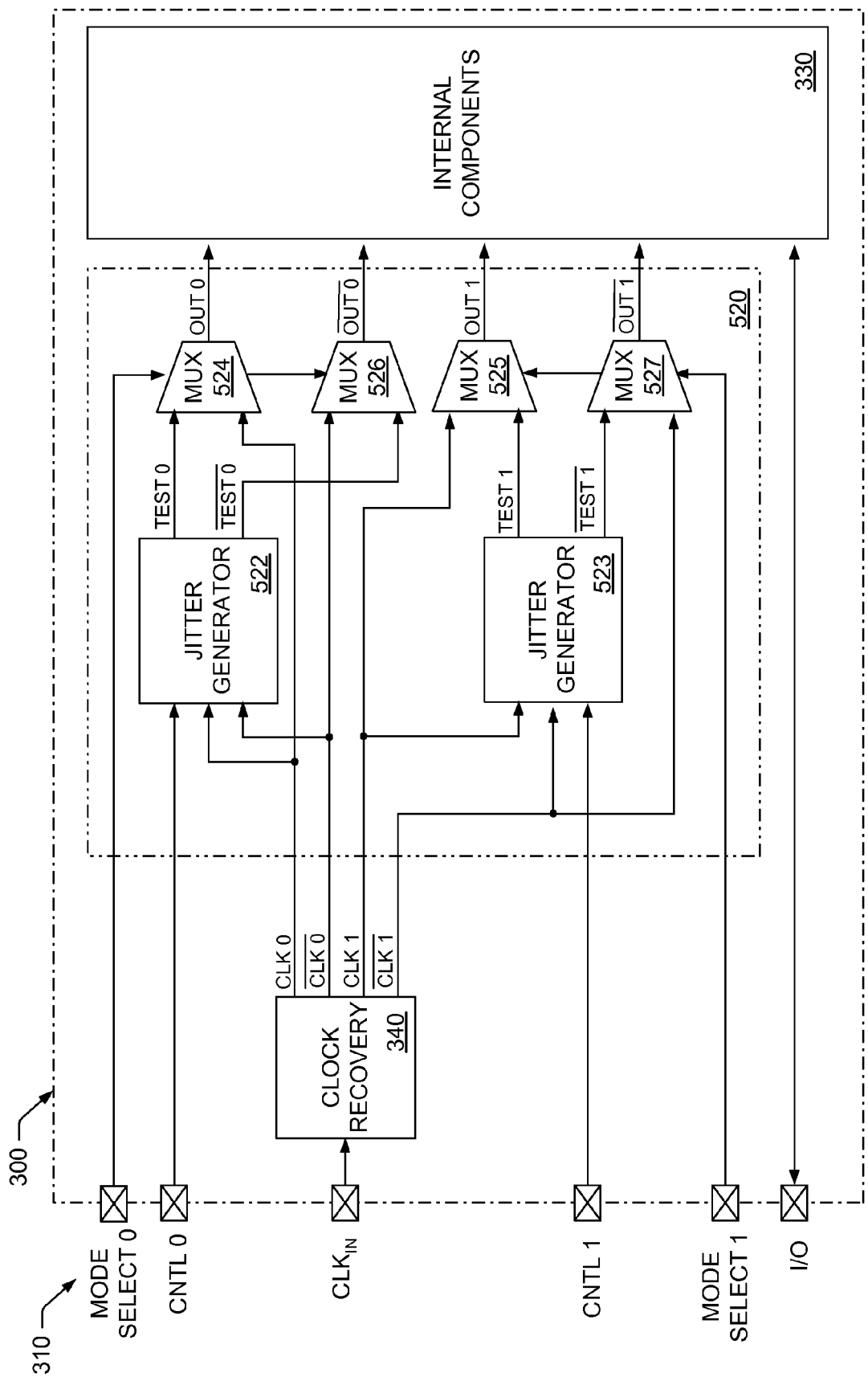
FIG. 5 is a block diagram illustrating yet another embodiment of an internal test circuit that may be used for determining the jitter and duty cycle distortion tolerance of one or more integrated circuits arranged on a monolithic IC chip or system board.

Exemplary embodiments of a test circuit are shown in FIGS. 3-5. In general, the test circuits described herein may be arranged upon a monolithic integrated circuit (IC) chip or system board (e.g., a printed circuit board) for testing the design margins of any component that may be included within the IC chip or system. For example, the test circuits may be used to determine the jitter and/or duty cycle distortion (DCD) tolerance of an internal component, whose timing is critical to the overall operation of the chip or system. Examples of internal components requiring (or benefiting) from jitter and/or DCD tolerance testing may include, but are not limited to, serial high speed data buses, parallel data buses, and the skew in clock distribution systems. In addition to jitter and DCD tolerance testing, the test circuits described herein may be used to fix design timing margins by changing the clock and data phases.

Unlike many conventional techniques, the test circuits shown in FIGS. 3-5 are included within the IC chip or system board layout, instead of an off-chip or off-system test apparatus. By providing an internal test circuit, a system designer (or end-user) may apply an internally generated test signal to only one component, a set of components, or all components requiring timing verification. An internal test circuit reduces the cost (especially in board space and timing margins) typically associated with external test circuits. The use of an internal test circuit also limits the amount of noise added to the clock distribution path by avoiding the additional I/O pins, connectors and logic components needed to supply an externally generated test signal to the internal components. Additional advantages/improvements over the prior art will become apparent in light of the description provided below.

As shown in FIGS. 3-5, the test circuits described herein may be arranged upon a monolithic substrate 300 for testing the design margins of one or more internal components 330. In some cases, monolithic substrate 300 may represent a packaged integrated circuit (IC) having one or more circuit components (e.g., a PLL within a large Gate Array chip or a SERDES chip) formed therein. In other cases, monolithic substrate 300 may represent a system board (otherwise referred to as a printed circuit board), having one or more circuit components (e.g., logic components, signal lines, ICs, etc.) formed within or mounted thereon. If mounted, the internal circuit components 330 may be coupled to substrate 300 by any well known means including, but not limited to, wire bonding, flip-chip and solder ball attachment.

In general, monolithic substrate 300 may include a plurality of input/output (I/O) pins 310, a test circuit (320, 420 or 520) and a number of internal components 330. In one embodiment (FIG. 3), the test circuit (320) may be configured for receiving an input signal directly from an external source (not shown) and for generating a test signal (TEST) in response thereto. For example, a clocking signal ($CLK_{IN}$) may be supplied to test circuit 320 from the transmitting portion of a communications system, or from the system clock of a computer system. As shown in FIG. 3, test circuit 320 may include a jitter generator 322 and an output multiplexer 324. As described in more detail below, the jitter generator may be configured for generating the test signal (TEST) by applying a highly controlled amount of jitter and/or duty cycle distortion to the input signal ($CLK_{IN}$). The output multiplexer may then be used to supply the test signal or the input signal (denoted OUT) to the internal components 330 of substrate 300, depending on a MODE SELECT signal supplied thereto.

In other embodiments, the test circuit (420, 520) may be configured for receiving a pair of differential input signals from a clock recovery device 340, as shown in FIGS. 4 and 5. For example, the clocking signal ($CLK_{IN}$) mentioned above may be supplied to a phase locked loop (PLL) or delay locked loop (DLL) device, instead of being supplied directly to the test circuit. These devices are often used to recover a sample clock frequency sent along with a data transmission, or to generate a plurality of clock frequencies (e.g., CLK0, CLK0 bar, CLK1, CLK1 bar) for distribution to various internal components. The latter is illustrated in FIGS. 4 and 5. Although PLLs and DLLs are specifically mentioned herein, one skilled in the art would understand how other clock recovery devices, crystal oscillators, or frequency multipliers could be used in place thereof.

As shown in FIG. 4 and 5, the test circuit (420 or 520) may include a jitter generator (422 or 522) and one or more output multiplexers (424, 426 or 524, 526). As described in more detail below, the jitter generator may be configured for generating a pair of differential test signals (TEST, TEST bar) by applying a highly controlled amount of jitter and/or duty cycle distortion to the pair of differential input signals (e.g., IN, IN bar or CLK0, CLK0 bar) supplied thereto. The output multiplexers are controlled by one or more MODE SELECT signals. These signals may be set by a system designer (or end-user) for supplying either the test signals or the input signals (e.g., OUT, OUT bar or OUT0 and OUT0 bar) to the internal components 330 of substrate 300.

In some embodiments (FIG. 4), the test circuit (420) may include an input multiplexer (428) for receiving the plurality of clock frequencies (e.g., CLK0, CLK0 bar, CLK1, CLK1 bar) generated by clock recovery device 340. The input multiplexer is controlled by an INPUT SELECT signal, which may be set by a system designer (or end-user) for providing one pair of clock frequencies (denoted IN and IN bar) to the jitter generator and output multiplexers. Use of the input multiplexer may enable the system designer (or end-user) to test the design margins of a particular internal component by generating and supplying the appropriate test signal thereto.

In other embodiments (FIG. 5), the test circuit (520) may include one or more additional jitter generators (523) and output multiplexers (525, 527), instead of the input multiplexer shown in FIG. 4. Providing additional jitter generators and output multiplexers enables the test circuit to generate a pair of test signals (e.g., TEST0, TEST0 bar and TEST1, TEST1 bar) for each pair of input signals (e.g., CLK0, CLK0 bar and CLK1, CLK1 bar) supplied thereto. If each pair of output multiplexers (524, 526 and 525, 527) is controlled by a separate MODE SELECT signal (e.g., MODE SELECT0 and MODE SELECT1), a system designer (or end-user) may test the design margins of one internal component, a set of internal components, or all internal components by selectively supplying a test signal or an input signal to each of the internal components coupled thereto.

The test signals generated by jitter generators 522 and 523 may be similar, in some cases, and dissimilar in others. For example, one set of test signals (e.g., TEST0, TEST0 bar) may be generated for testing the jitter tolerance of an internal component, while another set of test signals (e.g., TEST1, TEST1 bar) is generated for testing the tolerance of another internal component to duty cycle distortion. In another example, multiple sets of test signals (e.g., TEST0, TEST0 bar and TEST1, TEST1 bar) may be generated for testing the jitter tolerance of multiple internal components, which operate at different frequencies. As such, each test signal pair may be individually tailored for testing the design margins of a particular internal component.

In some cases, test signal generation may be controlled by a control signal (CNTL) or set of control signals (CNTL0, CNTL1) supplied to the jitter generators, as shown in FIGS. 3-5. In most cases, the control signal(s) may include a test pattern and a test frequency. As described in more detail below, the control signal(s) may be supplied to a programmable device, which may be included within the jitter generator(s) for generating the test pattern at the test frequency.

Figure 6:
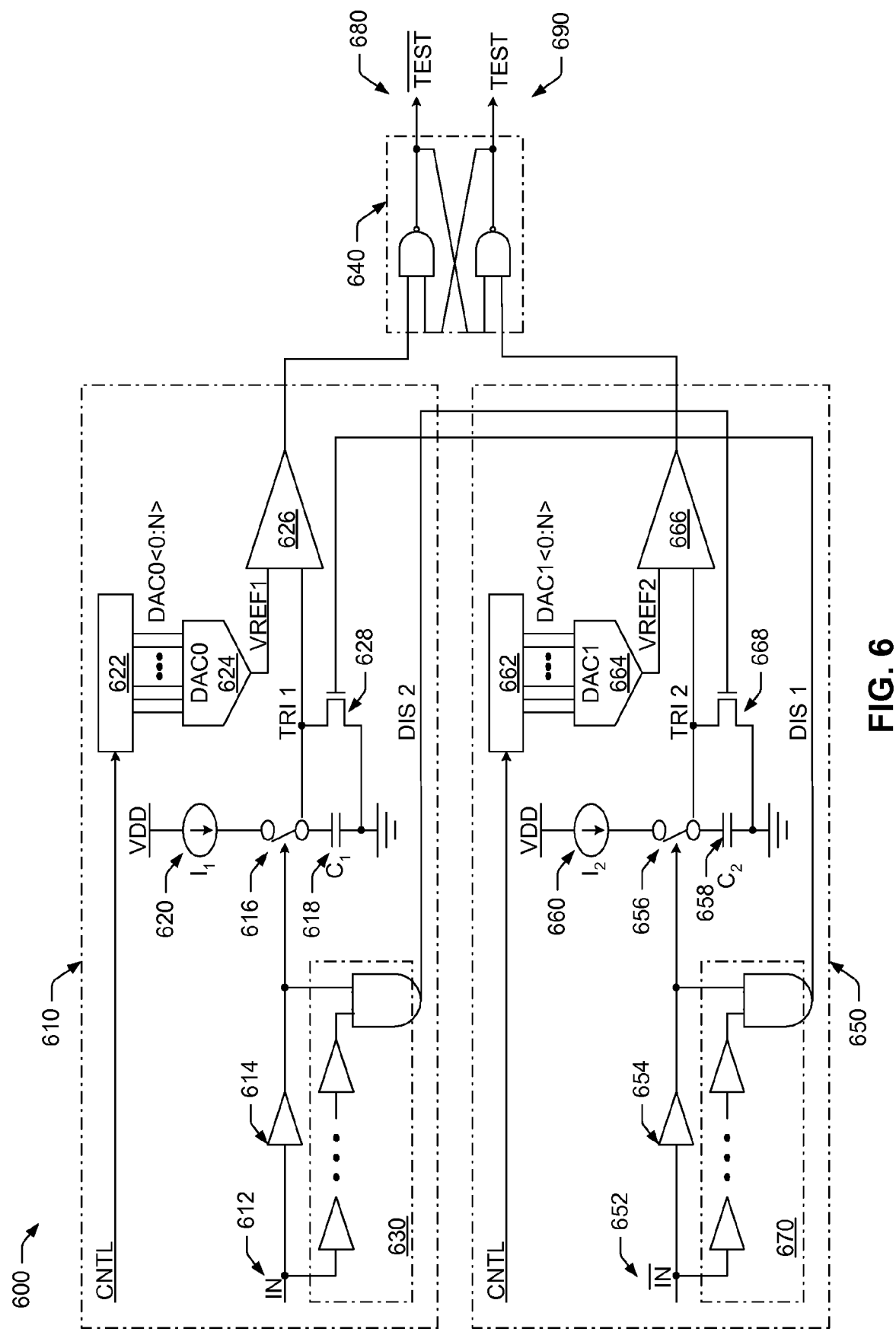
FIG. 6 is a simplified circuit diagram illustrating one embodiment of a jitter generator that may be included within the internal test circuits of FIGS. 4 and 5.

FIG. 6 illustrates one embodiment of a jitter generator 600 that may be included within the test circuits of FIGS. 3-5. As noted above, the jitter generator may be configured for generating a pair of differential test signals (e.g., TEST, TEST bar) by applying a highly controlled amount of jitter and/or duty cycle distortion (DCD) to the pair of differential input signals (e.g., IN, IN bar) supplied thereto. In a preferred embodiment of the invention, jitter and/or DCD may be applied to the input signals by modulating a phase of the input signals in accordance with a periodic signal. For this reason, jitter generator 600 may sometimes be referred to as a phase shift and duty cycle correction circuit. Although a brief description is provided below, details of the circuit may be found in application Ser. No. 11/014,578 entitled "PROGRAMMABLE PHASE SHIFT AND DUTY CYCLE CORRECTION CIRCUIT AND METHOD," incorporated herein in its entirety.

As shown in FIG. 6, jitter generator 600 includes a pair of substantially identical circuit blocks 610 and 650 for generating the pair of differential test signals (TEST and TEST bar). There is a certain advantage to implementing the jitter generator with substantially identical circuit blocks. For example, in addition to simplifying design and manufacturing processes, use of circuit blocks 610 and 650 provide jitter generator 600 with a relatively compact design by reducing the number of circuit elements usually required in such circuits.

Although jitter generator 600 includes two distinct circuit blocks, it should be noted that certain embodiments of the invention (e.g., FIG. 3) may include only one circuit block (e.g., 610) for generating a single-ended test signal. For example, a single-ended test signal may be generated for circuits or systems that do not require or benefit from DCD correction (e.g., circuits and systems that do not require a 50% duty cycle output waveform). For the sake of brevity, only the circuit elements shown in block 610 will be described in detail below. However, similar reference numerals are used to designate the same or similar components found in circuit block 650. Therefore, reference can be made to the description provided below for circuit block 610 to gain understanding of the circuit components and operation of circuit block 650.

In general, circuit block 610 may include an input conductor 612, a switch 616, a storage device 618, a charge sub-circuit 620, a discharge (or dump) sub-circuit 628 and a comparator 626. According to a preferred embodiment of the invention, a programmable means (622, 624) may also be included within circuit block 610 for setting a comparator reference voltage (otherwise referred to as a "slicing", "switching" or "comparator threshold" voltage). As described in more detail below, circuit block 610 may generate a test signal by adjusting the comparator reference voltage in accordance with a periodic signal stored within the programmable means.

As shown in FIG. 6, input conductor 612 is coupled for receiving one of the differential input signals (IN) supplied to jitter generator 600. The input signal, which may be temporarily delayed by buffer 614, is used for activating/deactivating switch 616. For example, switch 616 may be activated (i.e., turned ON) on rising edges of the input signal, and deactivated (i.e., turned OFF) on falling edges of the input signal. However, one skilled in the art will understand how the opposite may be true in other embodiments of the invention.

When turned ON, switch 616 may be closed for connecting charge sub-circuit 620 to storage device 618 and supplying a constant charging current thereto. For example, charge sub-circuit 620 is shown coupled between a power supply node (e.g., $V_{DD}$) and one terminal of switch 616, while storage device 618 is coupled between ground (e.g., $V_{SS}$) and the other terminal of switch 616. Closing switch 616 enables charge sub-circuit 620 to supply a controlled amount of current ($I_1$) to storage device 618, which in turn, charges storage device 618 to produce a linearly increasing voltage.

In general, charge sub-circuit 620 may be implemented with a voltage controlled current source, or any other charge pump style circuit, capable of supplying a controlled amount of current to storage device 618 via switch 616. In addition, storage device 618 may be implemented with a capacitor, or any other "integrator," capable of producing a linearly increasing voltage when supplied with a constant charging current. In most cases, the slope of the linearly increasing voltage may be directly proportional to the magnitude of the charging current, and inversely proportional to the capacitance of the storage device. Thus, the slope of the linearly increasing voltage may be changed by altering the amount of charging current and/or capacitance respectively provided by current source 620 and capacitor 618.

When turned OFF, switch 616 may be opened for disconnecting current source 620 from capacitor 618. However, instead of allowing the voltage stored within capacitor 618 to slowly decay according to a preset time constant, discharge sub-circuit 628 may be activated for resetting capacitor 618 and rapidly discharging the stored voltage to a ground potential. Once activated, discharge sub-circuit 628 provides an alternative current path by which the stored voltage can be quickly discharged (or "dumped") to ground. For this reason, discharge sub-circuit 628 may be alternatively referred to herein as a "dump" sub-circuit. In some cases, discharge sub-circuit 628 may include a single transistor, which is coupled in parallel to capacitor 618. However, discharge sub-circuit 628 may be implemented somewhat differently in other cases, without departing from the scope of the invention.

Figure 9:
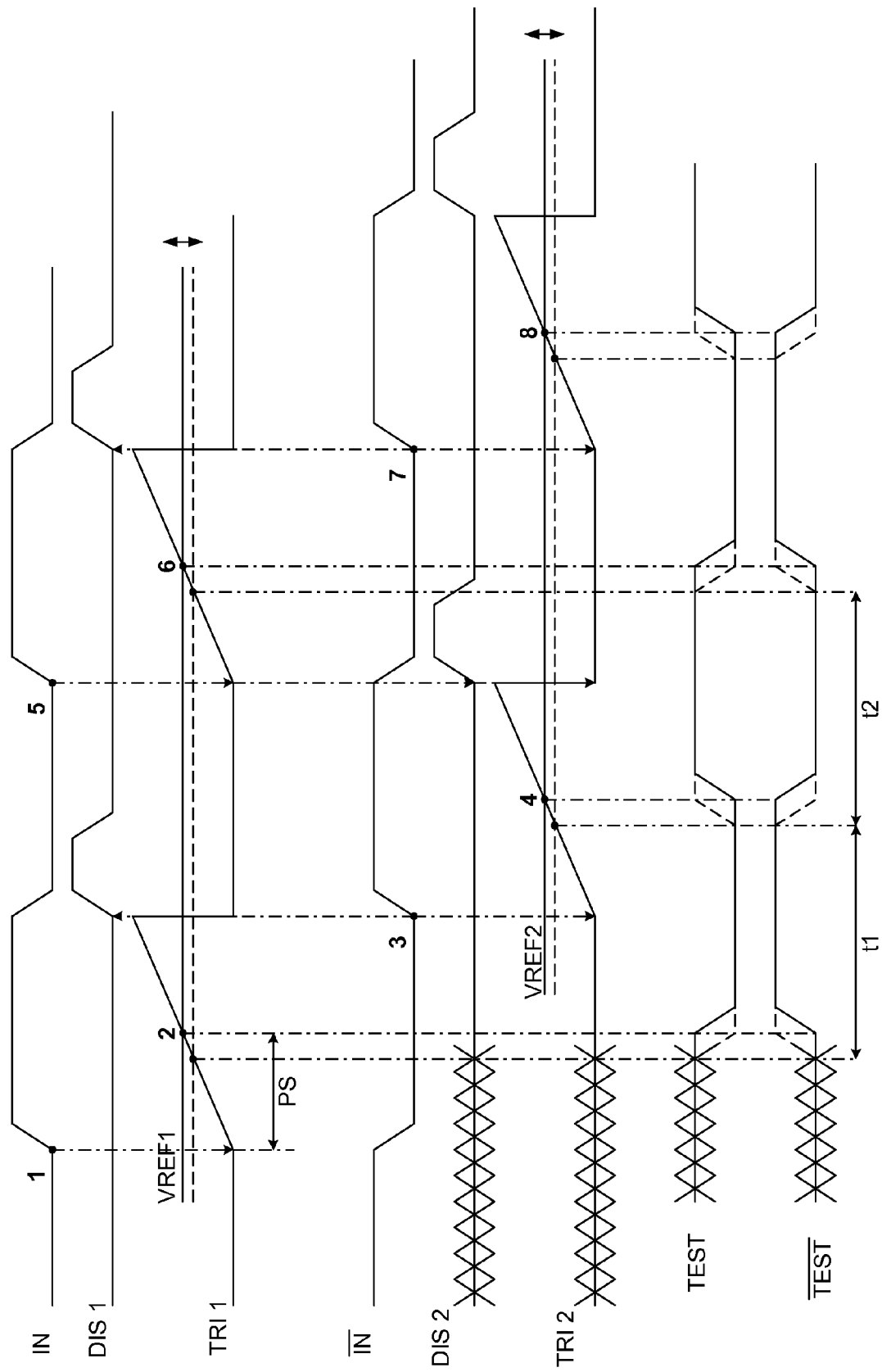
FIG. 9 is a timing diagram illustrating one manner in which a pair of test signals may be generated by adjusting a pair of reference voltages in accordance with the same periodic signal.
Figure 10:
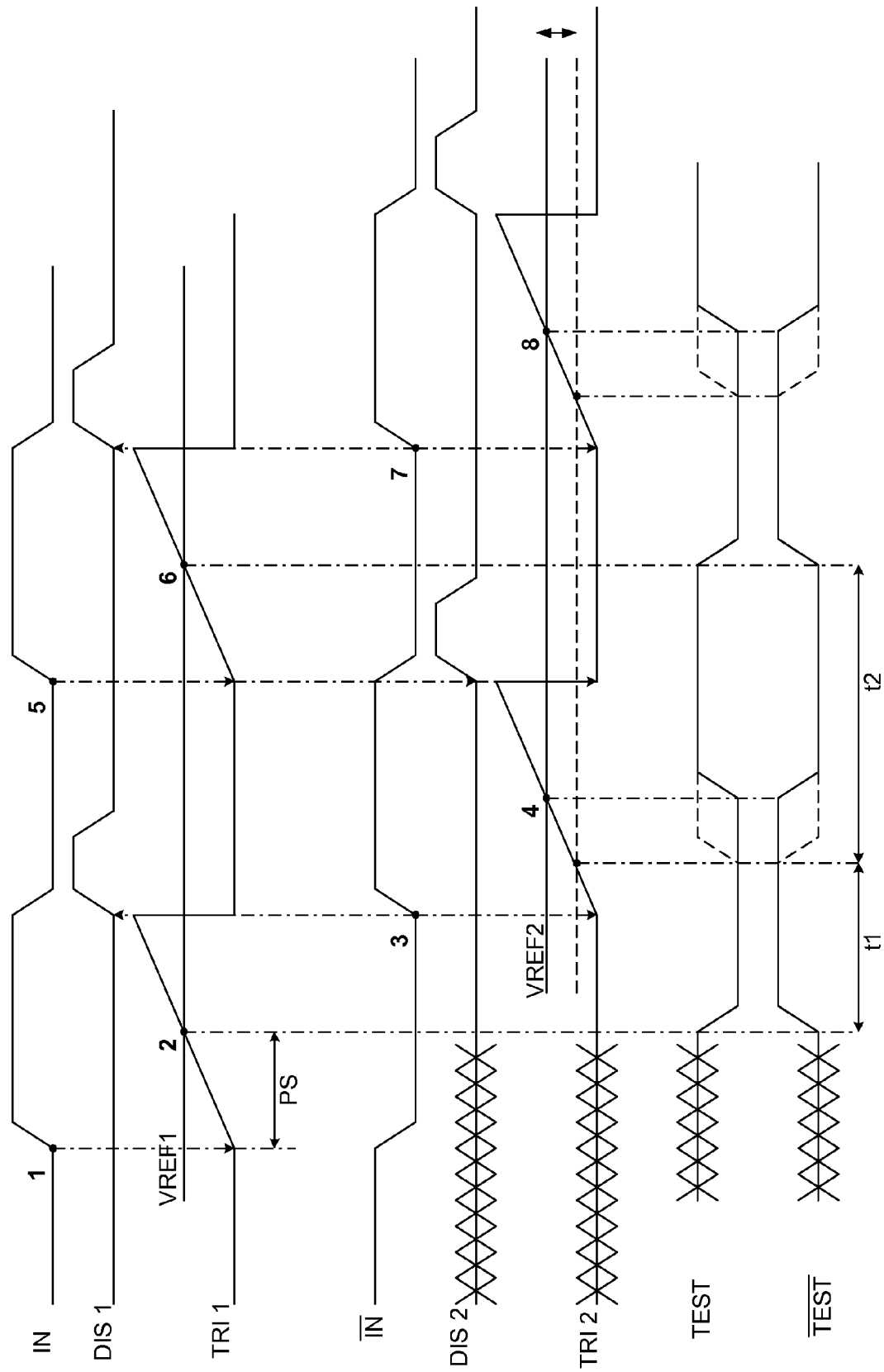
FIG. 10 is a timing diagram illustrating one manner in which a pair of test signals may be generated by adjusting only one of reference voltage in accordance with a periodic signal.

In some embodiments (FIG. 3), transistor 628 may be activated by a discharge signal (DIS 1) generated by the falling edge of the input waveform (IN) supplied to circuit block 610. In other embodiments (FIGS. 4-5), the discharge signal (DIS 1) may be generated by and received from circuit block 650. For example, the discharge signal (DIS 1) used for activating transistor 628 may occur on rising edges of the complementary input signal (IN bar) received by circuit block 650. Capacitor 618 may remain in a reset state until the next rising edge of the input signal (IN) enables current to once again flow into capacitor 618 (i.e., by closing switch 616), giving rise to another linearly increasing voltage. In some cases, the cycle of charging and discharging capacitor 618 may repeat at the frequency of the differential input signals (IN, IN bar), yielding a triangular (TRI 1) or saw tooth shaped waveform, as shown in FIGS. 9 and 10 and described in more detail below.

In some embodiments, circuit blocks 610 and 650 may each be configured for generating a discharge signal (DIS 1, DIS 2). This may be achieved, in some cases, by adding a delay sub-circuit between the input conductor of one circuit block and the discharge sub-circuit of another circuit block, as shown in FIG. 6. For example, delay sub-circuit 670 may be included within circuit block 650 for producing a first discharge signal (DIS 1) on rising edges of the complementary input signal (IN bar). This first discharge signal is supplied to transistor 628 of circuit block 610 for resetting capacitor 618 and discharging the linearly increasing voltage (TRI 1) stored therein. In addition, delay sub-circuit 630 may be included within circuit block 610 for generating a second discharge signal (DIS 2) on rising edges of the input signal (IN). The second discharge signal is supplied to transistor 668 of circuit block 650 for resetting capacitor 658 and discharging another linearly increasing voltage (TRI 2) stored therein. As noted in the co-pending application, use of delay sub-circuits 630 and 670 provides a unique means for adjusting the phase difference between the input signals and the generated test signals. For example, the phase difference may be adjusted by applying equal amounts of phase change to each half of the input signal period to restore the 50% duty cycle of the generated test signals.

In some cases, delay sub-circuits 630 and 670 may each include a chain of buffers coupled to a two-input AND gate, as shown in FIG. 6. In this configuration, delay sub-circuits 630 and 670 may be used for generating a predetermined amount of delay sufficient to completely discharge capacitors 658 and 618, respectively. As described in more detail below, the amount of phase shift may be adjusted in a periodic manner to apply jitter and/or DCD to the generated test signals by supplying variable reference voltages (VREF1 and VREF2) to the comparators (626 and 666).

As shown in FIG. 6, comparator 626 may be coupled for receiving the triangular waveform (TRI 1) generated through repeated charging and discharging of capacitor 618, and a reference voltage (VREF 1) for comparison therewith. In addition, comparator 666 of circuit block 650 may be similarly coupled for receiving the triangular waveform (TRI 2) generated through repeated charging and discharging of capacitor 658, and another reference voltage (VREF 2) for comparison therewith. In this manner, comparators 626 and 666 may generate a pair of differential test signals (TEST, TEST bar) by transitioning the test signals to an opposite logic level once the linearly increasing voltages (TRI 1, TRI 2) exceed the comparator reference voltages (VREF 1, VREF 2).

In some cases, the test signals generated by comparators 626 and 666 may be fed to driver circuit 640. If included, driver circuit 640 may be used for driving the test signals upon output conductors 680 and 690. In one embodiment, a simple latch circuit comprising cross-coupled NAND gates may be used to implement driver circuit 640, although other configurations may be possible. For example, driver circuit 640 may be implemented with NOR gates, in other embodiments of the invention.

As noted above, a programmable means may be included within circuit blocks 610 and 650 for adjusting the reference voltages (VREF 1, VREF 2) supplied to comparators 626 and 666. In some embodiments, the reference voltages may be adjusted by supplying an adjustable voltage to an external circuit pin. In other embodiments, the adjustable reference voltages may be generated through the use of a resistor divider network or reference voltage generation circuit (e.g., a bandgap circuit).

In preferred embodiments of the invention, however, the adjustable reference voltages are generated by supplying a periodic signal to a digital-to-analog converter (DAC). For example, a periodic signal may be supplied to DAC 624 and/or DAC 664 of FIG. 6. In most cases, the periodic signal may be generated by storing a test pattern within a programmable device (622, 662), which in turn, is configured for supplying the test pattern to the DAC at a predetermined test frequency. As described in more detail below, the frequency of the periodic signal, and thus, the frequency with which the reference voltage is adjusted, is determined by the predetermined test frequency and the number of data points included within the test pattern. Exemplary programmable devices include, but are not limited to, registers, counters, and various types of volatile and non-volatile memory (such as read-only memory, ROM, erasable programmable ROM, EPROM, random access memory, RAM, flash memory, etc).

Figure 7:
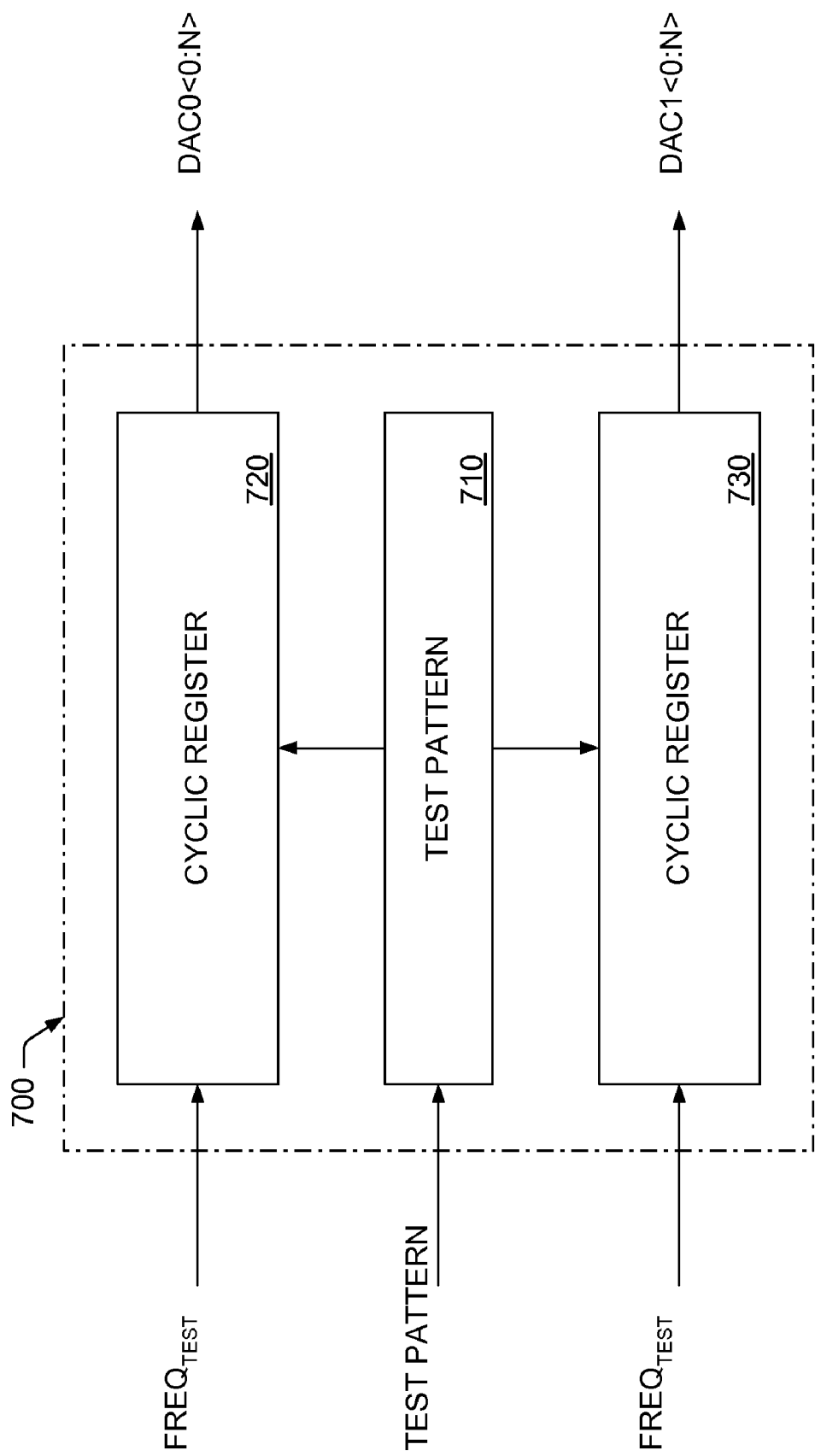
FIG. 7 is a block diagram illustrating one embodiment of a programmable device that may be included within the jitter generator of FIG. 6 for controlling the generation of the test signals shown in FIGS. 9 and 10.

FIG. 7 illustrates one embodiment of a programmable device (700) that may be included within jitter generator 600 for controlling the adjustable reference voltages (VREF 1, VREF 2) generated by DAC 624 and DAC 664. In general, programmable device 700 includes a number of storage devices for storing a test pattern (or test patterns) and a number of "cyclic" registers for controlling the manner in which the test pattern(s) is supplied to the DACs. For example, programmable device 700 may include a first register 710 for storing a test pattern supplied thereto, and a second "cyclic" register 720 for controlling the manner in which the test pattern is supplied to DAC 624 of circuit block 610. In some cases, a third "cyclic" register 730 may be included for controlling the manner in which the test pattern is supplied to DAC 664 of circuit block 650. The configuration shown in FIG. 7 may, therefore, be used when the same test pattern is supplied to DACs 624 and 664.

In other cases (not shown), only the first and second registers may be included within programmable device 700. This configuration enables a different programmable device 700—with possibly different test patterns and/or different test frequencies—to be used for controlling DACs 624 and 664. The following description assumes that a separate programmable device is included within circuit blocks 610 and 650, as shown in FIG. 6.

In most cases, the test pattern stored within the first register 710 may include a set of precomputed data points, which form a periodic signal when supplied to the DAC in succession. For example, the precomputed data points may form a trigonometric (such as a sine, cosine, etc.) waveform, a triangular waveform, a saw tooth waveform or a rectangular waveform when supplied to the DAC in succession. The test frequency (FREQ$_{TEST}$) supplied to the second register 720 determines the frequency at which the precomputed data points are supplied to the DAC. In some cases, the test pattern and the test frequency may be set by a system designer (or end-user) by supplying the appropriate control signals (CNTL) to jitter generator 600. In other cases, the test pattern and/or the test frequency may be provided by on-chip components.

As noted above, the frequency of the periodic signal, and thus, the frequency with which the reference voltage is adjusted, is determined by the test frequency and the number (N) of precomputed data points in the test pattern. In one example, a test pattern may include N=10 data points representing one period of a sine wave. If the test pattern is supplied to the DAC at a test frequency of 1 MHz, the frequency of the periodic signal may be substantially equal to 1 MHz/10 points, or approximately 100 KHz. It is noted, however, that the test frequency (FREQ$_{TEST}$) and/or the number of precomputed data points may be individually chosen for adjusting the reference voltage at a desired rate. Regardless of the particular test pattern chosen, jitter amplitude (i.e., noise) may be generated by storing the test pattern (e.g., one full sine wave of noise amplitude) within the cyclic register and repeatedly reading the contents of the register.

In some cases, the first register (710) may be implemented with a storage device, while the second register (720) is implemented with a cyclic register. Examples of appropriate storage devices include, but are not limited to, I$^2$C registers, latches, read only memory (ROM) and random access memory (RAM). Examples of cyclic registers include, but are not limited to, shift registers and memory devices with cycle pointers. However, registers 710 and 720 are not limited to the examples provided herein, and may be implemented with alternative devices in other embodiments of the invention.

In some cases, the periodic signal generated by the first and second registers may be supplied to the DAC as a series of N-bit digital words (e.g., DAC0<0:N>). The DAC functions by converting each of the N-bit digital words into an analog value representing a reference voltage (e.g., VREF 1). The resolution of the DAC is generally determined by the number of bits in the N-bit digital word. In some cases, the number of bits (N) may be selected from a range of integer values between approximately 2 and 8 (or more). For example, a 5-bit digital word may be input to the DAC for generating a reference voltage within a range of available voltages extending between about 0 and (31/32)V$_{DD}$. Though 5-bits may provide sufficient resolution in some applications, the number of bits included within the N-bit digital word may be increased (or decreased) to provide a larger (or smaller) range of reference voltage options.

Providing the DAC with a periodic signal enables the DAC 624 to generate a first reference voltage (VREF 1) that changes in accordance with the frequency and amplitude of the periodic signal supplied thereto. Another periodic signal—similar or dissimilar to the first—may be supplied to DAC 664 of circuit block 650 for generating a second adjustable reference voltage (VREF 2). As described in more detail below, the periodic signals supplied to DACs 624 and 664 may be used to generate the test signals by applying jitter and/or duty cycle distortion (DCD) to the input signals supplied to jitter generator 600.

For example, jitter may be applied by modulating the phase of the input signals supplied to jitter generator 600. More specifically, jitter may be applied by periodically changing the reference voltages (VREF 1, VREF 2) generated by DACs 624 and 664 and supplied to comparators 626 and 666. This may be achieved, in some embodiments, by supplying periodic signals to DAC 624 and DAC 664, as described above.

In some cases, a pair of jittered test signals may be generated by supplying the same periodic signal (i.e., the same test pattern and test frequency) to DACs 624 and 664. This enables the jittered test signals to be generated at the duty cycle of the input signals (IN, IN bar) supplied to the jitter generator, so that the jitter tolerance of an internal component may be determined without introducing duty cycle distortion (DCD). Such a case is illustrated in FIG. 9 and described in more detail below. In other cases, DCD tolerance may be tested by supplying substantially different periodic signals (or fixed values) to DAC's 624 and 664. One example of the test signals generated during DCD tolerance testing is shown in FIG. 10.

Reference will now be made to FIGS. 6 and 9 to illustrate how a pair of test signals (TEST, TEST bar) may be generated by applying jitter to a pair of differential input signals (IN, IN bar) supplied to jitter generator 600. Test signal generation is described below in the context of phases of operation (denoted 1-8). For example, and as shown in FIG. 9, the input signal (IN) supplied to jitter generator 600 may transition to a logic HIGH voltage during a first phase (1) of operation. If this occurs, switch 616 will be activated and a constant current ($I_1$) will be supplied from current source 220 to capacitor 618 for producing a linearly increasing voltage (TRI 1) therein. As shown in FIG. 9, the linearly increasing voltage (TRI 1) may cross the first threshold voltage (VREF 1) set by DAC 624 during a second phase (2) of operation. At this point, the output generated by comparator 626 may produce a logic HIGH test signal (TEST) and logic LOW complementary test signal (TEST bar). Note: the opposite may be true in alternative embodiments of the invention.

Capacitor 618 is discharged by the narrow pulse (DIS 1) received from delay sub-circuit 670 of circuit block 650 during a third phase (3) of operation. This represents the end of the first integration phase and the beginning of a second integration phase. For example, and as shown in FIG. 9, the input signal (IN) supplied to jitter generator 600 may transition to a logic LOW voltage during the third phase of operation. If this occurs, switch 656 will be activated and a constant current ($I_2$) will be supplied from current source 660 to capacitor 658 for producing another linearly increasing voltage (TRI 2) therein. Comparator 666 will switch in the fourth phase (4) of operation, once the linearly increasing voltage (TRI 2) within capacitor 658 crosses the second threshold voltage (VREF 2) set by DAC 664. At the switch point, comparator 666 may produce a logic LOW test signal (TEST) and a logic HIGH complementary test signal (TEST bar). Note: the opposite may be true in alternative embodiments of the invention. Capacitor 658 is discharged by the narrow pulse (DIS 2) received from delay sub-circuit 630 of circuit block 610 in the fifth phase (5) of operation.

Following the fourth phase, the cycle of charging and discharging capacitors 618 and 658 may be repeated (see phases 5, 6, 7 and 8 of FIG. 9) at the frequency of the input signal or at another frequency which may be set, for example, by the end-user. A similar sequence of operations is shown in FIG. 10.

As illustrated in FIGS. 9 and 10, the test signals (TEST, TEST bar) generated by comparators 626 and 666 may transition to an opposite logic level once the linearly increasing voltages (TRI 1, TRI 2) within capacitors 618 and 658 cross the comparator reference voltages (VREF 1, VREF 2) set by DACs 624 and 664. In some cases (FIG. 9), jitter may be applied to the test signals by modulating each of the reference voltages with the same periodic signal (i.e., with the same test pattern and test frequency). This enables the rising and falling edge transitions of the test signals to be shifted in the same direction and by the same amount, thereby introducing jitter while preserving the duty cycle of the input signals supplied to jitter generator 600. As known in the art, the duty cycle of a signal is the ratio of "high time" (e.g., t1 for TEST bar) to the overall period (e.g., t1+t2) of the signal.

In other cases (FIG. 10), duty cycle distortion may be applied to the test signals by modulating only one of the reference voltages with a periodic signal. For example, and as shown in FIG. 10, the reference voltage (VREF 2) supplied to comparator 666 may be modulated with a periodic signal, while the reference voltage (VREF 1) supplied to comparator 626 remains fixed. This introduces duty cycle distortion by shifting the rising edge transitions of the TEST signal, while the falling edges remain fixed. The opposite may be true for the TEST bar signal. As known in the art, duty cycle distortion (DCD) occurs when the phase shift during the rising edge of an input wave is not the same as the phase shift during the falling edge of the same wave. Although not specifically illustrated herein, DCD may also be introduced by modulating each of the reference voltages with substantially different periodic signals. For example, a fixed DCD can be produced by loading two different VREF1 and VREF2 into DAC's 624 and 664.

Figure 11:
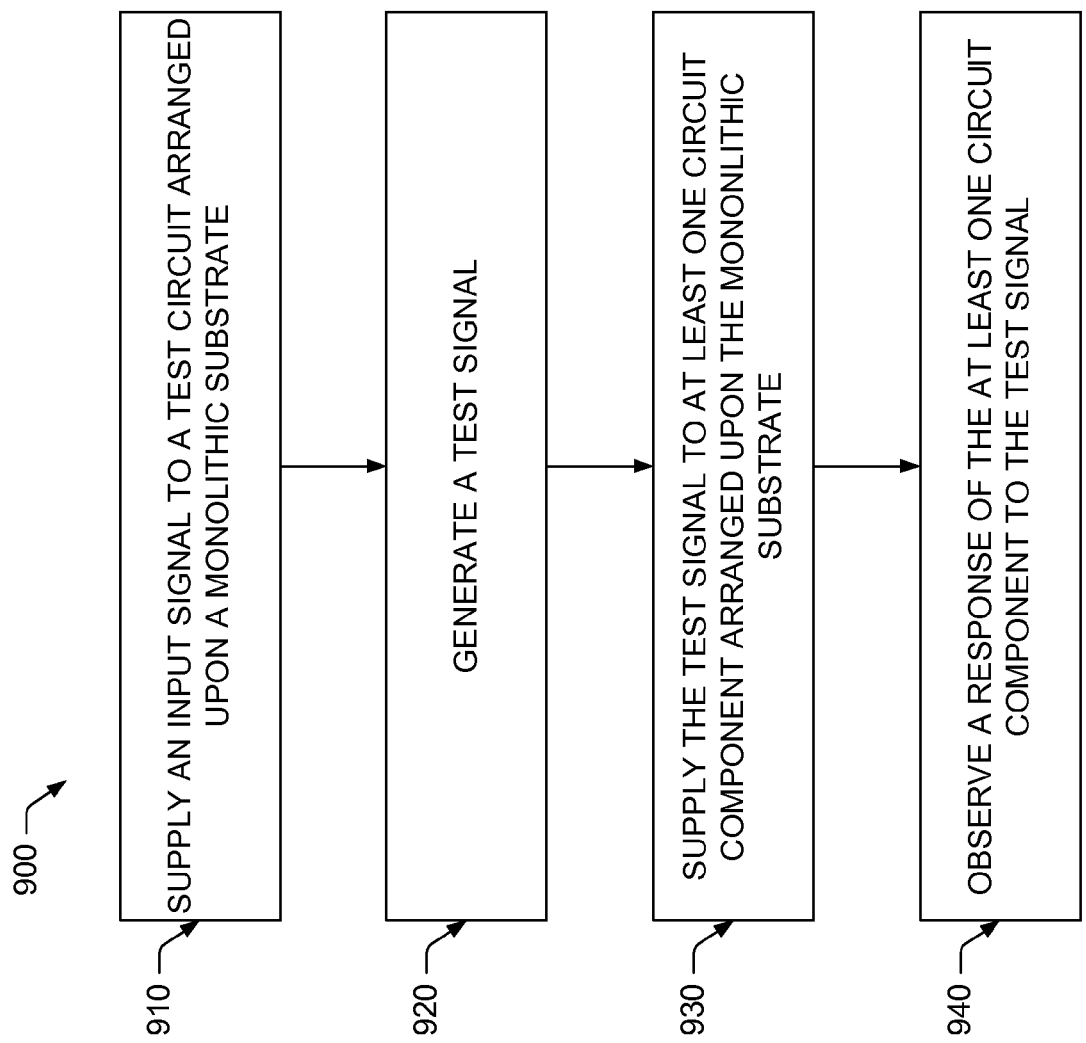
FIG. 11 is a flow chart diagram illustrating one embodiment of a method that may be used for testing one or more circuit components arranged upon a monolithic substrate.

FIG. 11 illustrates one embodiment of a method 900 that may be used for testing one or more circuit components arranged upon a monolithic substrate. For the sake of consistency, the one or more circuit components may be referred to as "internal circuit components." In some cases, the method may begin by supplying an input signal to a test circuit arranged upon the monolithic substrate (step 910). As noted above, the input signal supplied to the test circuit may be single-ended in some embodiments (such as the $CLK_{IN}$ signal supplied to the test circuit of FIG. 3), and differential in others (such as the CLK0 and CLK0 bar signals supplied to the test circuits of FIGS. 4 and 5).

In most embodiments, the test circuit may include a jitter generator (600), which is implemented with a pair of substantially identical circuit blocks (610, 650), as shown in FIG. 6 and described above. However, if a single-ended input signal is supplied to the test circuit, the jitter generator of FIG. 6 may include a single ended input to differential buffer converter (e.g., an inverter) for converting the single-ended input signal into a differential input signal. In other words, the inputs to the jitter generator should be true and complement in nature. To minimize mismatches, the layout of block 610 is used for block 650.

In some cases, the test circuit may be used to generate a test signal by modulating the phase of the input signal(s) supplied thereto (step 920). As noted above, the test signal generated by the test circuit may be single-ended in some embodiments (such as the TEST signal generated by the test circuit of FIG. 3), and differential in others (such as the TEST and TEST bar signals generated by the test circuits of FIGS. 4 and 5). In most cases, the test signal(s) may be generated by applying jitter and/or duty cycle distortion (DCD) to the input signal(s) supplied to the test circuit. For example, jitter and/or DCD may be applied by changing one or more of the comparator reference voltages (VREF 1, VREF 2) in a periodic manner. This may be achieved, in some embodiments, by adjusting a first reference voltage (e.g., VREF 1) in accordance with a first periodic signal (supplied, e.g., to DAC 624) and a second reference voltage (e.g., VREF 2) in accordance with a second periodic signal (supplied, e.g., to DAC 664).

Once the appropriate test signals are generated, at least one of the internal circuit components may be tested for jitter tolerance and/or DCD tolerance by supplying the test signals to the internal circuit component (step 930) and observing its response (step 940). In some cases, the first and second reference voltages may be set substantially identical to one another (i.e., with the same test pattern and test frequency) so that jitter tolerance may be determined without introducing duty cycle distortion. On the other hand, DCD tolerance may be determined by adjusting only one of the first and second reference voltages, or by using substantially different first and second periodic signals or non-periodic signals.

An improved test circuit and method for testing the internal components of a monolithic substrate have now been described in reference to FIGS. 3-7 and 9-11. As mentioned above, the test circuits described herein improve upon conventional test circuits by including the test circuits on the same monolithic substrate (e.g., the same IC chip or system board layout) as the circuit components requiring timing verification. By providing an internal test circuit, instead of an off-chip or off-system test apparatus, a system designer (or end-user) may apply an internally generated test signal to only one component, a set of components, or all components requiring timing verification. The use of an internal test circuit may also limit the amount of noise added to the clock distribution path by avoiding the additional I/O pins, connectors and logic components typically needed to supply an externally generated test signal to the internal components.

Further advantages are provided by the test circuits shown in FIGS. 3-6. For example, jitter generator 600 may be used to generate the test signals by applying a highly controlled amount of jitter and/or DCD to the input signals supplied thereto. The amount of jitter and/or DCD is accurately controlled by using opposite phases of the input signals (IN, IN bar) to generate the linearly increasing voltages (TRI 1, TRI 2), and periodic signals to generate the adjustable reference voltages (VREF 1, VREF 2). The ability to control the amount of jitter and/or DCD applied to the test signals distinguishes the present invention over conventional techniques, which fail to provide such control.

As another advantage, jitter generation may be performed after a clock recovery device (340) is used to recover a sample clock frequency sent along with a data transmission, or to generate a plurality of clock frequencies (e.g., CLK0, CLK0 bar, CLK1, CLK1 bar) for distribution to various internal components. For example, and as shown in FIGS. 4 and 5, one or more jitter generators may be arranged after a phase locked loop (PLL) or delay locked loop (DLL) device. This enables jitter and/or duty cycle distortion to be injected into the clock frequencies generated by such devices, and represents an improvement over conventional jitter generators, which attempt to inject jitter (or noise) into the reference frequency (Fref) or control voltage (Vctrl) supplied to the devices.

As noted above, injecting noise into the reference frequency tends to produce an uncontrollable jitter amplitude. In addition to producing an uncontrollable jitter amplitude, injecting noise into the control voltage may shift the test signal frequency away from a desired operating frequency of the internal circuit component. This may invalidate jitter tolerance tests performed in systems or circuits specifically designed for operating at the desired frequency. In some cases, adding noise to the VCO control voltage may cause the PLL to lock onto the noise frequency, if the noise frequency is lower than that of the loop. This, too, would impede jitter tolerance tests by not allowing a jittered test signal to be supplied to circuit components within the DUT. By arranging the jitter generator(s) after a PLL or DLL device, as shown in FIGS. 4 and 5, the timing margin can be tested after the resynchronization of data to its recovered clock. The test circuits described herein can also be used to: (i) provide a controlled jitter amplitude, (ii) generate the test signals at the frequency of the input signals, and (iii) generate the test signals without terminating VCO oscillations.

Figure 8:
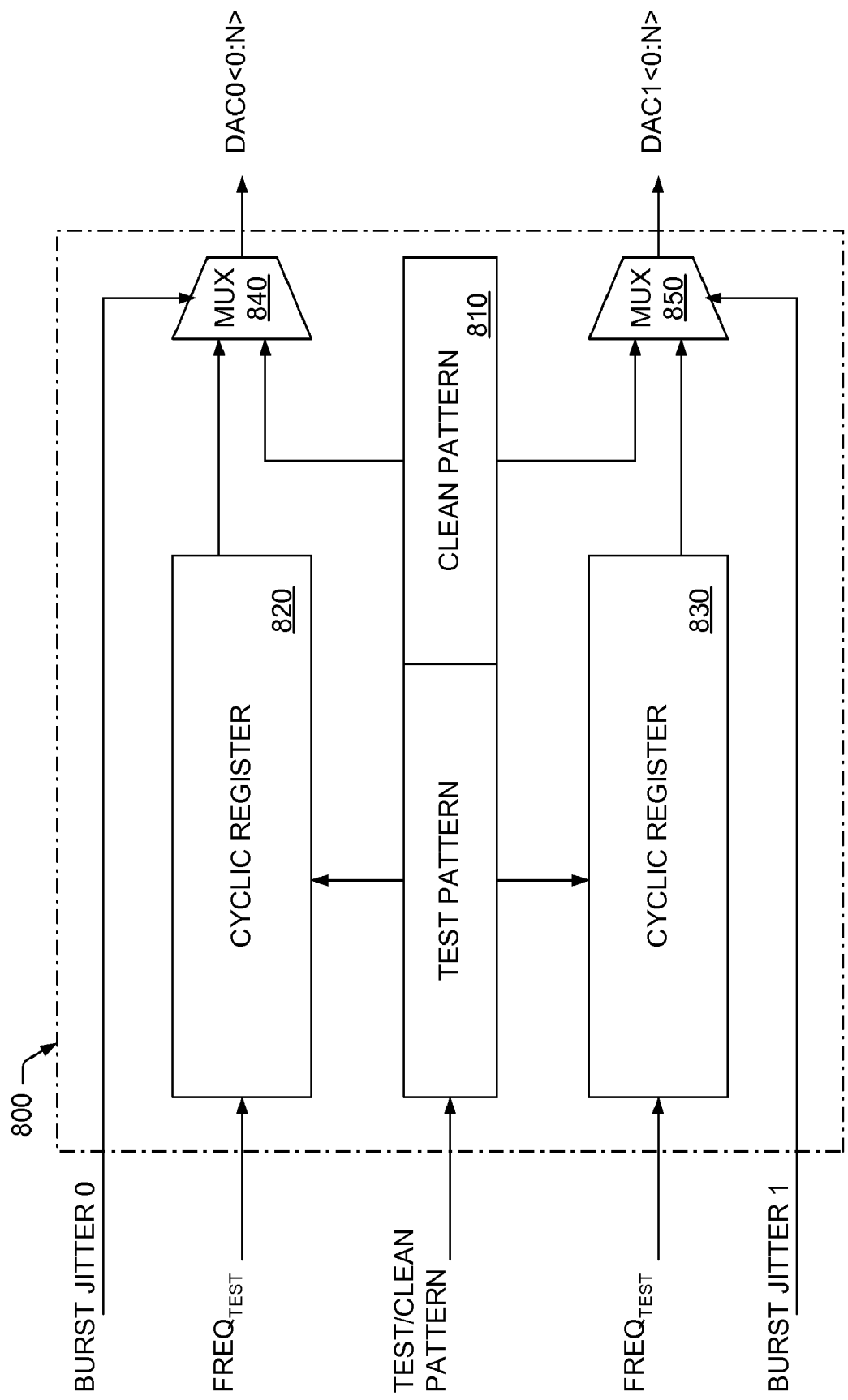
FIG. 8 is a block diagram illustrating another embodiment of a programmable device that may be included within the jitter generator of FIG. 6 for controlling the generation of the test signals shown in FIGS. 9 and 10.

FIG. 8 illustrates another embodiment of a programmable device (800) that may be included within jitter generator 600 for controlling the adjustable reference voltages (VREF 1, VREF 2) generated by DAC 624 and DAC 664. In general, programmable device 800 includes many of the circuit components found in programmable device 700. For example, programmable device 800 includes a first register 810 for storing a test pattern supplied thereto, and a second "cyclic" register 820 for controlling the manner in which the test pattern is supplied to DAC 624 of circuit block 610. In addition, a third "cyclic" register 830 may be included for controlling the manner in which the test pattern is supplied to DAC 664 of circuit block 650.

However, programmable device 800 differs from programmable device 700 by providing the option of storing a "clean" pattern, along with the test pattern stored in register 810. For example, a "clean" pattern may include a set of precomputed data points, which function to maintain a constant reference voltage when supplied to the DAC in succession. In other words, the "clean" pattern may represent a non-periodic or non-jittered test signal. In addition to the "clean" pattern stored within register 810, programmable device 800 may include a pair of multiplexers 840 and 850. As shown in FIG. 8, the pair of multiplexers may be coupled to registers 820 and 830 for supplying either the test pattern (i.e., the periodic signal) or the clean pattern (i.e., the non-jittered test signal) to DACs 624 and 664 based on a control signal (BURST JITTER 0, BURST JITTER 1) supplied to the multiplexers.

In some cases, the clean pattern may be selected until the appropriate BURST JITTER signal is asserted. Once the appropriate control signal is asserted, the test pattern may be supplied to the DAC for a duration of time determined by the control signal. Inserting "bursts" of jitter and/or duty cycle distortion into a "clean" clock environment may allow a system designer (or end-user) to test a downstream clock recovery device. For example, "bursts" of jitter and/or duty cycle distortion may be injected to determine whether or not a PLL will lock onto a dynamic injection of phase error and jitter, or to determine how much phase shift will "kill" the PLL. In other cases, the BURST JITTER signals may be periodically asserted and de-asserted for interleaving the clean pattern and test pattern to test how a system will respond to dynamic changes in phase and jitter.

It will be appreciated to those skilled in the art having the benefit of this disclosure that this invention is believed to provide an improved test circuit, system and method for testing one or more components arranged upon or within a monolithic substrate. More specifically, the invention provides improved means for generating a test signal applying a highly controlled amount of jitter and/or duty cycle distortion to an input signal. Such means typically include a jitter generator, which is configured for generating the test signal by modulating a phase of the input signal in accordance with a periodic signal. Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A test circuit arranged within or upon a monolithic substrate, the test circuit comprising:
   a jitter generator configured to receive an input signal, wherein the jitter generator is configured for generating a jittered test signal by modulating a phase of the input signal in accordance with a periodic signal, wherein the periodic signal comprises a set of precomputed data points, and wherein the jitter generator comprises:
- a digital-to-analog converter (DAC) configured to generate an adjustable reference voltage that changes in accordance with the periodic signal;
- a comparator configured to receive the adjustable reference voltage and a linearly increasing voltage signal generated in response to the input signal, wherein the comparator is configured for generating the jittered test signal by shifting the phase of the input signal each time the linearly increasing voltage signal exceeds the adjustable reference voltage; and
- a programmable device configured for storing the periodic signal, wherein the programmable device is coupled to the DAC for controlling the changes made to the adjustable reference voltage; and
- a first multiplexer configured to supply either the input signal or the jittered test signal to one or more components arranged within or upon the monolithic substrate.

2. The test circuit as recited in claim 1, wherein the precomputed data points control the changes made to the adjustable reference voltage when supplied to the DAC in succession.

3. The test circuit as recited in claim 2, wherein the periodic signal is selected from a group comprising a trigonometric waveform, a triangular waveform, a saw tooth waveform and a rectangular waveform.

4. The test circuit as recited in claim 2, wherein the programmable device comprises:
- a first register configured for storing the precomputed data points representing the periodic signal; and
- a second register configured for supplying the precomputed data points to the DAC in succession and at a test frequency supplied to the second register.

5. The test circuit as recited in claim 4, wherein the first register is selected from a group comprising an I²C register, a latch, a read-only memory (ROM) and a random access memory (RAM).

6. The test circuit as recited in claim 4, wherein the second register is selected from a group comprising shift registers and memory devices with cycle pointers.

7. The test circuit as recited in claim 4, wherein the programmable device further comprises:
- a third register configured for storing another set of precomputed data points, which maintain a constant reference voltage when supplied to the DAC in succession, and therefore, represent a non jittered test signal; and
- a second multiplexer coupled for sup lying either the periodic signal or the non-jittered test signal to the DAC based on a control signal supplied to the multiplexer.

8. A system, comprising:
one or more integrated circuits arranged upon a monolithic substrate;
a test circuit arranged upon the monolithic substrate, wherein the test circuit is configured to: (i) receive an input signal at an input frequency, (ii) generate a test signal by modulating a phase of the input signal in accordance with a periodic signal, wherein the periodic signal comprises a set of precomputed data points, wherein the test circuit generates the test signal by:
generating an adjustable reference voltage that changes in accordance with the periodic signal;
generating a voltage signal in response to the input signal;
shifting a phase of the input signal in response to detecting that the voltage signal exceeds the adjustable reference voltage; and
(iii) supplying either the input signal or the test signal to the one or more integrated circuits based on a control signal supplied to the test circuit.

9. The system as recited in claim 8, wherein the test circuit is configured for generating the test signal at the same frequency as the input signal.

10. The system as recited in claim 9, wherein the test circuit comprises:
- a jitter generator configured for modulating the phase of the input signal by adjusting a reference voltage in accordance with the periodic signal; and
- an output multiplexer configured for supplying either the input signal or the test signal to the one or more integrated circuits based on the control signal applied to the test circuit.

11. The system as recited in claim 10, wherein the system further comprises a clock recovery device configured for generating a plurality of input signals based on a clock signal supplied thereto from an external source.

12. The system as recited in claim 11, wherein the dock recovery device is selected from a group comprising a phase locked loop (PLL) and a delay locked loop (DLL).

13. The system as recited in claim 11, wherein the jitter generator is coupled for receiving and using one of the plurality of input signals for generating the test signal.

14. The system as recited in claim 13, wherein the test circuit further comprises an input multiplexer coupled for receiving the plurality of input signals from the clock recovery device and configured for selecting the one input signal to be supplied to the jitter generator.

15. The system as recited in claim 13, wherein the test circuit further comprises:
- one or more additional jitter generators, each coupled for receiving a different one of the input signals from the clock recovery de device and configured for generating a different test signal in response thereto; and
- one or more additional output multiplexers, each coupled to the clock recovery device and one of the additional jitter generators for supplying a respective input signal or a respective test signal to one of the integrated circuits.

16. A method for one or more circuit components arranged upon a monolithic substrate, the method comprising:
supplying an input signal to a test circuit arranged upon the monolithic substrate;
using the test circuit to generate a test signal by modulating a phase of the input signal in a periodic manner defined by a set of precomputed data points; and
testing at least one of the circuit components by supplying the test signal to the at least one circuit component and observing a response of the at least one circuit component, wherein the phase of the input signal is modulated by adjusting a first reference voltage in accordance with a first periodic signal and a second reference voltage in accordance with a second periodic signal.

17. The method as recited in claim 16, wherein the test signal is generated at the same frequency as the input signal is supplied to the test circuit.

18. The method as recited in claim 16, wherein the step of testing comprises determining a tolerance of the at least one circuit component to jitter by setting the first and second periodic signals identical to one another.

19. The method as recited in claim 16, wherein the step of testing comprises determining a tolerance of the at least one circuit component to duty cycle distortion by adjusting only one of the first and second reference voltages, or by using substantially different first and second periodic signals.

* * * * *